United States Patent
Heid

(10) Patent No.: US 6,310,478 B1
(45) Date of Patent: Oct. 30, 2001

(54) MAGNETIC REASONANCE TOMOGRAPHY APPARATUS AND METHOD IN THE FORM OF A PULSE SEQUENCE FOR OPERATING SAME

(75) Inventor: Oliver Heid, Gunzenhausen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/484,557

(22) Filed: Jan. 18, 2000

(30) Foreign Application Priority Data

Jan. 18, 1999 (DE) .............................. 199 01 763

(51) Int. Cl.$^7$ ...................................... G01V 3/00
(52) U.S. Cl. .......................... 324/309; 324/309; 324/307
(58) Field of Search .................. 324/309, 307, 324/312, 314, 322

(56) References Cited

U.S. PATENT DOCUMENTS 5,541,514  7/1996  Heid et al. ........................... 324/309
6,034,528 * 7/2000  Heid .................................... 324/309

OTHER PUBLICATIONS

"Dante Ultrafast Imaging Sequence (DUFIS)," Lowe et al., J. Mag. Res. Series B 101 (1993), pp. 106–109.
"Ultra–Rapid Gradient Echo Imaging," Heid et al., Mag. Res. in Med., vol. 33 (1995), pp. 143–149.
"Imaging Systems for Medical Diagnostics," Krestl. (1990), pp. 544–547.

* cited by examiner

Primary Examiner—Louis Arana
Assistant Examiner—Brij B. Shrivastav
(74) Attorney, Agent, or Firm—Schiff Hardin & Waite

(57) ABSTRACT

In a method in the form of a pulse sequence for ultra-rapid nuclear magnetic resonance tomography and a magnetic resonance tomography apparatus operating according to the method, image data are obtained in a pulse sequence wherein the magnetization vector oscillates by an angle ±α in the steady stage, with a being smaller then 90°. This is the case, for example, given a SSFP sequence. RF pulse train composed of a number of RF pulses is respectively emitted during one-half of a readout gradient. A bipolar readout gradient pulse train can be employed, with an RF pulse train being emitted during a negative half of the readout gradient pulse train.

14 Claims, 5 Drawing Sheets

MAGNETIC REASONANCE TOMOGRAPHY APPARATUS AND METHOD IN THE FORM OF A PULSE SEQUENCE FOR OPERATING SAME

BACKGROUND OF THE INVENTION

1. Field of the Invention

The present invention is directed to a pulse sequence for a nuclear magnetic resonance tomography apparatus as well as to a nuclear magnetic resonance tomography apparatus operating according to such a pulse sequence.

2. Description of the Prior Art

The invention also relates to techniques that employ pulse sequences wherein, in the steady state, the magnetization vector oscillates between $+\alpha/2$ and $-\alpha/2$ given excitation pulses of $\pm\alpha$. Examples of such pulse sequences are the SSFP and the FISP pulse sequences.

German PS 44 27 497 discloses a pulse sequence for a magnetic resonance tomography apparatus. In this pulse sequence, a pulse sequence usually referred to as "FISP" (fast imaging with steady precession) is employed. The term "FISP" is a known concept in the field of computed tomography for a specific pulse sequence and is expressly explained, for example, in E. Krestel, "Imaging Systems for Medical Diagnostics", Siemens AG, 1990, pages 544 through 547. According to the pulse sequence disclosed by German PS 44 27 497, such an FISP pulse sequence is modified such that a radio-frequency pulse is emitted in a preparation phase preceding the FISP pulse sequence. This radio-frequency pulse is frequency-selective and is emitted under the influence of a slice selection gradient, so that only a slice of the examination subject is excited. The dephasing caused by the slice selection gradient is in turn canceled by an oppositely directed gradient. The radio-frequency pulse has a flip angle that generates an excursion of the magnetization as occurs in the stationary state of the following pulse sequence. In general, the magnetization vector oscillates between $+\alpha/2$ and $-\alpha/2$ given excitation pulses of $\pm\alpha$, and the radio-frequency pulse must then have a flip angle of $\alpha/2$ with a angle that is position inverted relative to the following radio-frequency excitation pulse.

In the steady state, as stated, the magnetization vector oscillates between plus $\alpha/2$ and $-\alpha 2$ given excitation pulses of $\pm\alpha$. For achieving rapid imaging, the spin magnetization represents a problem since this is not yet in the steady state at the beginning of the measurement and leads to signal fluctuations between the echoes, i.e. raw data rows, that produce image artifacts. The method proposed by German PS 44 27 497 solves this problem before the beginning of the actual FISP sequence by placing the magnetization into an approximate condition of the steady state by a preceding RF excitation pulse.

Further, a sequence known as an SSFP pulse sequence (steady state free precession) is known, for example from the aforementioned publication by Krestel, which differs from the FISP sequence essentially in that refocusing gradient pulses are employed in all three directions.

O. Heid et al, "Ultra-Rapid Gradient Echo Imaging", Magnetic Resonance in Medicine, Vol. 33, pages 143 through 149, 1995, disclose a method for rapid imaging on the basis of a gradient echo magnetic resonance technique. An equidistant RF pulse train is thereby applied (see FIG. 1) during a phase of a constant readout field gradient, resulting in a number of k-space paths being produced.

This latter technique is an example of techniques referred to as burst methods which, however, have the disadvantage that the signal that is read out rapidly drops with increasing measuring speed. Given SSFP signals, however, the signal amplitude is preserved given a high repetition rate (echo rate). SSFP techniques, however, have the disadvantage that the obtainable measuring speed is greatly limited by a high number of gradient switching ramps per echo. "Journal of Magnetic Resonance", B 101, pages 106–109, 1993, discloses a pulse sequence wherein the RF excitation pulse train is emitted during a constant magnetic field gradient. The readout of the signal ensues during the same constant magnetic field gradient that was already present during the application of the RF excitation pulse train.

Japanese Application 9-262 219 likewise discloses pulse sequence for nuclear magnetic resonance tomography wherein an RF excitation pulse train is emitted during a positive half of the readout gradient (see FIG. 6), and the signal readout ensues during the switching of a negative half of the readout gradient.

German OS 42 32 883 discloses modulation techniques for radio-frequency pulses usually employed in magnetic resonance.

SUMMARY OF THE INVENTION

An object of the present invention is to improve an SSFP (steady state free precession) method such that the measuring speed can be increased.

This object is achieved according to the present invention in a method for ultra-rapid magnetic resonance tomography and a magnetic resonance tomography apparatus wherein a pulse sequence is employed to obtain the image data such that the magnetization vector oscillates between angles of $\pm\alpha$ in the steady state, with a being less than 90°, and wherein a pulse train composed of a number of RF pulses is emitted during one-half of a readout gradient of the pulse sequence.

In particular, a bipolar readout gradient pulse train can be employed, with the RF pulse train composed of a number of RF pulses being emitted during a negative half of the bipolar readout gradient pulse train. Only two gradient switching ramps per n echoes thus are required, thereby enabling a nearly unlimited measuring speed.

The RF pulses can be amplitude-modulated and/or phase-modulated, so that spin echoes and stimulated echoes arising during a pulse train, and thus the loss of useable spin magnetization due to echo path splitting, are reduced insofar as possible.

The gradient switching can be completely rephasing in all spatial directions from RF pulse train to RF pulse train. It should be noted that this complete rephasing of the gradient switching is another difference over the known burst method.

Each RF pulse train can be composed of a first RF pulse train part and a second RF pulse train part, the first and second RF pulse train parts each being composed of a number of RF pulses. The first RF pulse train part is fashioned such that the (residual) z-magnetization arising from the preceding RF pulse train is deflected into the XY plane, and the second RF train is fashioned such that the magnetization is again turned back into the z-direction.

The phase coding gradient circuit can include a spoiler gradient between the first and the second RF pulse train parts (as seen in terms of time).

The inventive magnetic resonance tomography apparatus is operated with a pulse sequence control that is fashioned for the implementation of an ultra-rapid nuclear magnetic resonance tomography with a pulse sequence, wherein the magnetization vector oscillates between angles of ±α in the steady state, with α being smaller than 90°. This is the case, for example, in the known SSFP technique.

The pulse sequence control controls an RF stage and a gradient circuit such that the RF excitation pulse train composed of a number of RF pulses is emitted respectively during one-half of a readout gradient of the pulse sequence.

DESCRIPTION OF THE PREFERRED EMBODIMENTS

Figure 6:
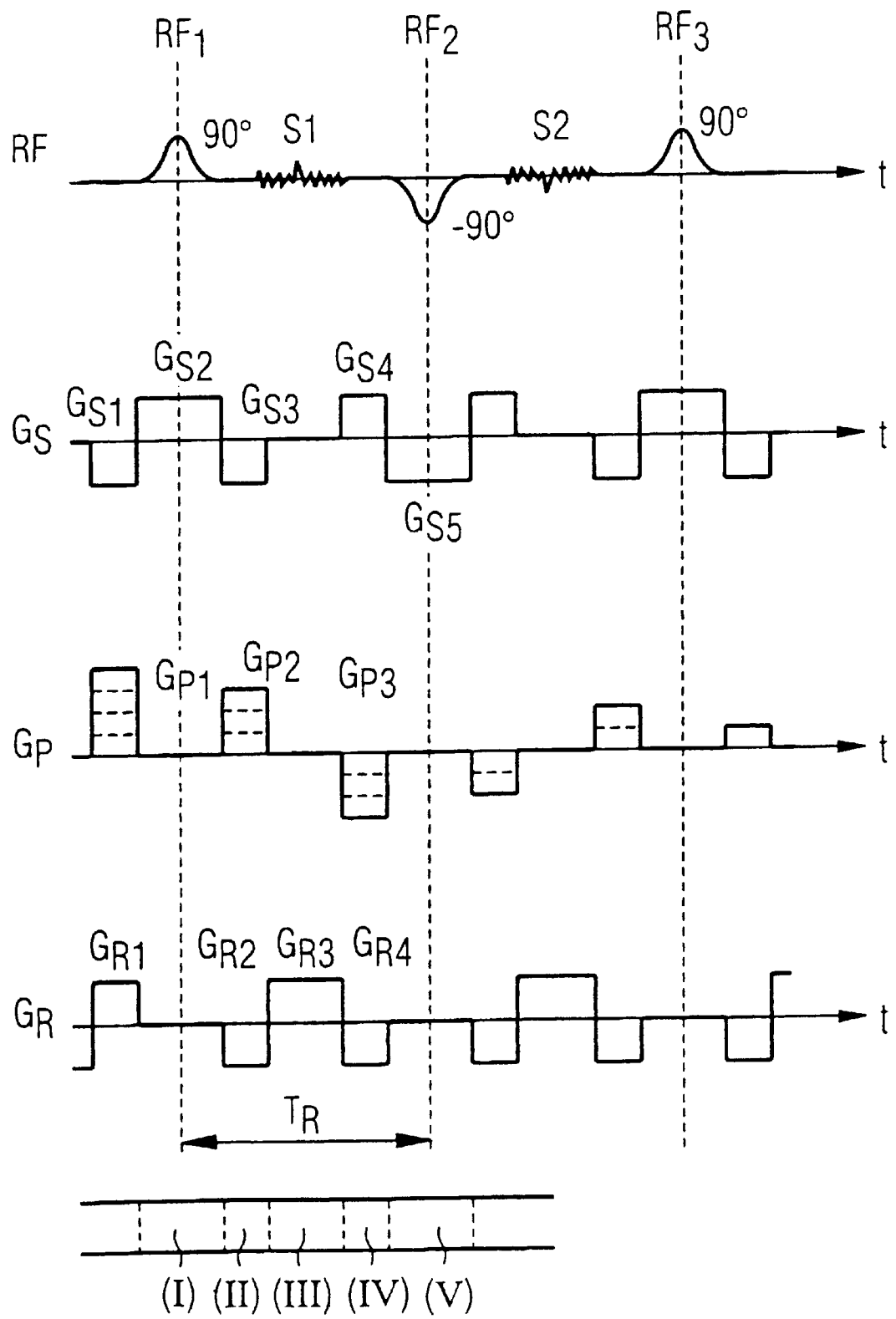
FIG. 6 shows a gradient switching diagram as is known from the prior art.

With reference to FIG. 6, a pulse sequence referred to as a TRUE-FISP (fast imaging with steady precession) is explained first. Each sub-sequence begins in a time segment I with a radio frequency excitation pulse $RF_1$, which has a flip angle of 90° in the exemplary embodiment. The radio frequency pulse $RF_1$ is frequency-selective and is emitted under a slice selection gradient pulse $GS_2$, so that only a selected slice of the examination subject is excited. In a time segment II, a dephasing of the nuclear magnetization in a readout direction ensues as a result of a gradient $G_{R2}$. Further, a phase coding gradient pulse $G_{P2}$ as well as a gradient pulse $GS_3$ directed opposite the slice selection gradient pulse $GS_2$ are activated in time segment II. As a result of the gradient pulse $GS_3$, the dephasing caused by the slice selection gradient pulse $GS_2$ is in turn cancelled.

In time segment III, a readout gradient pulse $G_{R3}$ is activated, and thus a rephasing of the nuclear spins occurs, so that a nuclear magnetic resonance signal S1 arises. This nuclear magnetic resonance signal S1 is sampled and employed for producing an image in a conventional way.

In a time segment IV, a slice selection gradient pulse $G_{S4}$ in a positive slice selection direction, a gradient pulse $G_{P3}$ opposite the gradient pulse $G_{P2}$ and a gradient pulse $G_{R4}$ in a negative readout direction are activated. In a time segment V, finally, a radio frequency pulse $R_{F2}$ having a flip angle of −90° is activated under a slice selection gradient pulse $G_{S5}$ in the negative slice selection direction. The illustrated pulse sequence is repeated n times with different /values of the phase coding gradient pulses $G_{P2}$. The phase angle of the radio frequency excitation pulses is RF inverted from pulse sequence to pulse sequence, so that the operational signs of the flip angles effected by the excitation pulses RF alternate. The spacing between two radio frequency excitation pulses RF is referenced $T_R$ (repetition time). All gradients are switched such that their time integral over a repetition time $T_R$ yields zero.

A rapid imaging is possible given this method, since the repetition time $T_R$ can be made significantly shorter than the relaxation times T1 and T2.

Given the illustrated pulse sequence, the excursion of the magnetization is brought to 90° by the first radio frequency excitation pulse $RF_1$ and is brought to approximately 0° by the second radio frequency excitation pulse $RF_2$, so that only every other radio frequency excitation generates an echo signal. Only after an echo response that lies approximately on the order of magnitude of T1 or T2 is a stationary steady state achieved, whereby the flip angle moves between +45° and −45°. Until this stable condition is achieved, the nuclear magnetic resonance signal oscillates greatly and cannot be interpreted in practice.

In the present invention, for example, a SSFP pulse sequence can be employed instead of the FISP pulse sequence, the SSFP sequence differing from the FISP sequence essentially in that refocusing gradient pulses are employed in all three directions.

The present invention refers generally to a technique wherein image data are obtained according to a pulse sequence, wherein the magnetization vector oscillates in the steady state between ±α/2 and −α/2 given excitation pulses of +α. FISP or SSFP are examples of such pulse sequences.

Figure 1:
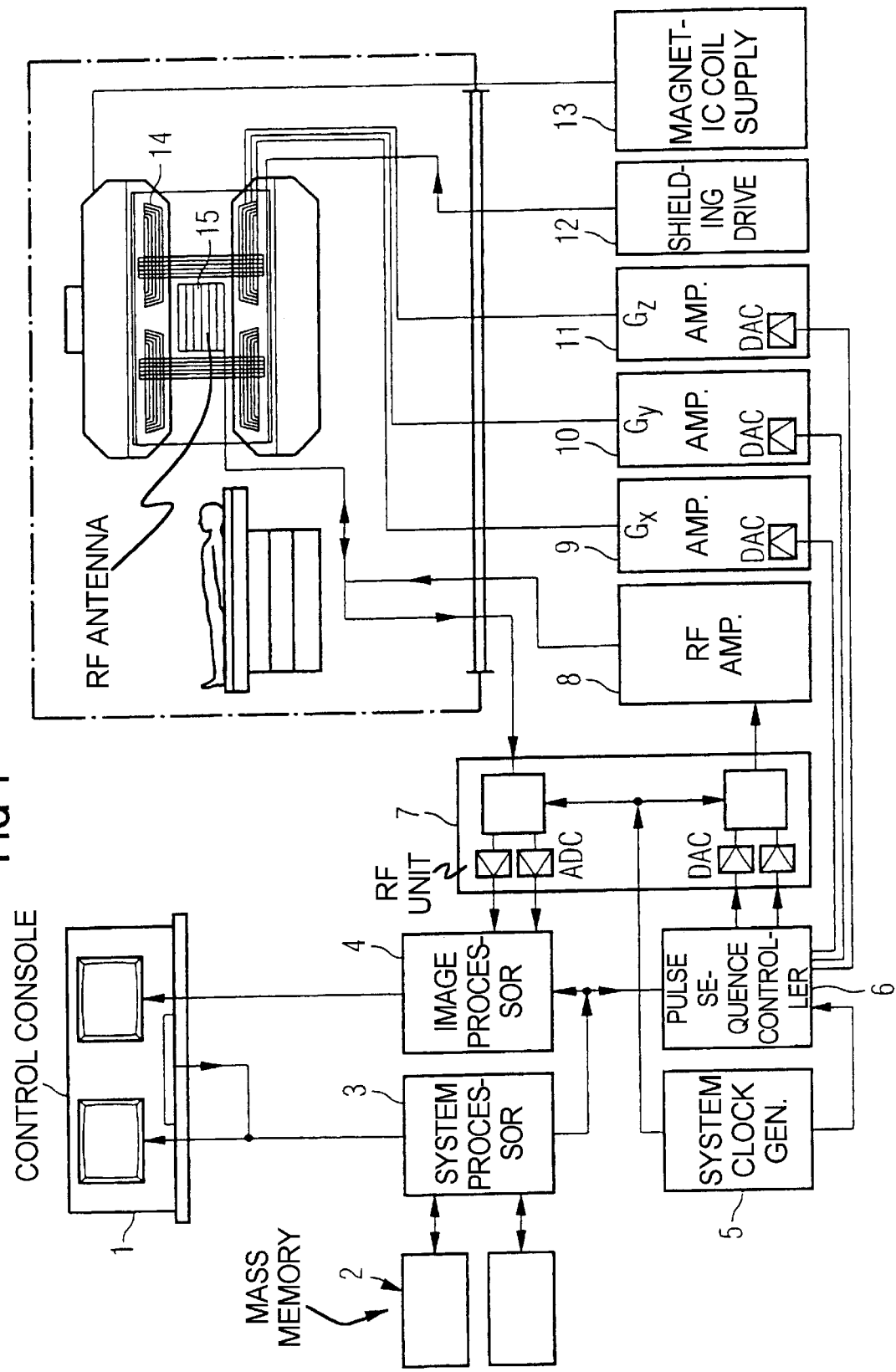
FIG. 1 is a schematic circuit diagram of an inventive magnetic resonance tomography apparatus.

Referring to FIG. 1, the general structure of an inventive nuclear magnetic resonance tomography apparatus shall now be explained. This apparatus has a control panel 1, a mass memory 2, a system processor 3, an image processing 4, a system clock generator 4, a pulse sequence controller 6, an RF stage 7, an RF amplifier ϵ, a $G_x$ (readout) gradient amplifier 9, a $G_y$ (phase coding) gradient amplifier 10, a $G_z$ (readout) amplifier 11, a shielding control 12, a magnetic coil supply 13, gradient coils 14 as well as an RF resonator/antenna 15. For the present invention, it is particularly the structure and function of the pulse sequence controller 6, the RF stage 7, the readout gradient amplifier 9, of the gradient coils 14 as well as the RF resonators/antenna 15 that are of significance.

An inventive pulse sequence diagram shall now be explained with reference to FIG. 2. Of significance is that the readout gradient pulse $G_R$ is bipolar. A number of RF pulses are thereby emitted per negative half of the gradient readout pulse train. Accordingly, a number of echoes corresponding to the number of RF pulses that were emitted during the negative half can be obtained in the positive half of the readout gradient pulse train. A number of RF pulses are then again emitted in the following (positive) half of the readout gradient pulse train.

Features of the inventive pulse sequence, which is based on a steady state free precession sequence, are thus as follows:

bipolar readout gradient pulse train a sequence of RF pulses (pulse train) that are respectively emitted during a gradient half, namely during the negative gradient half of the readout gradient pulse train, and phase and amplitude modulation of the RF pulses of an RF pulse train.

Figure 2:
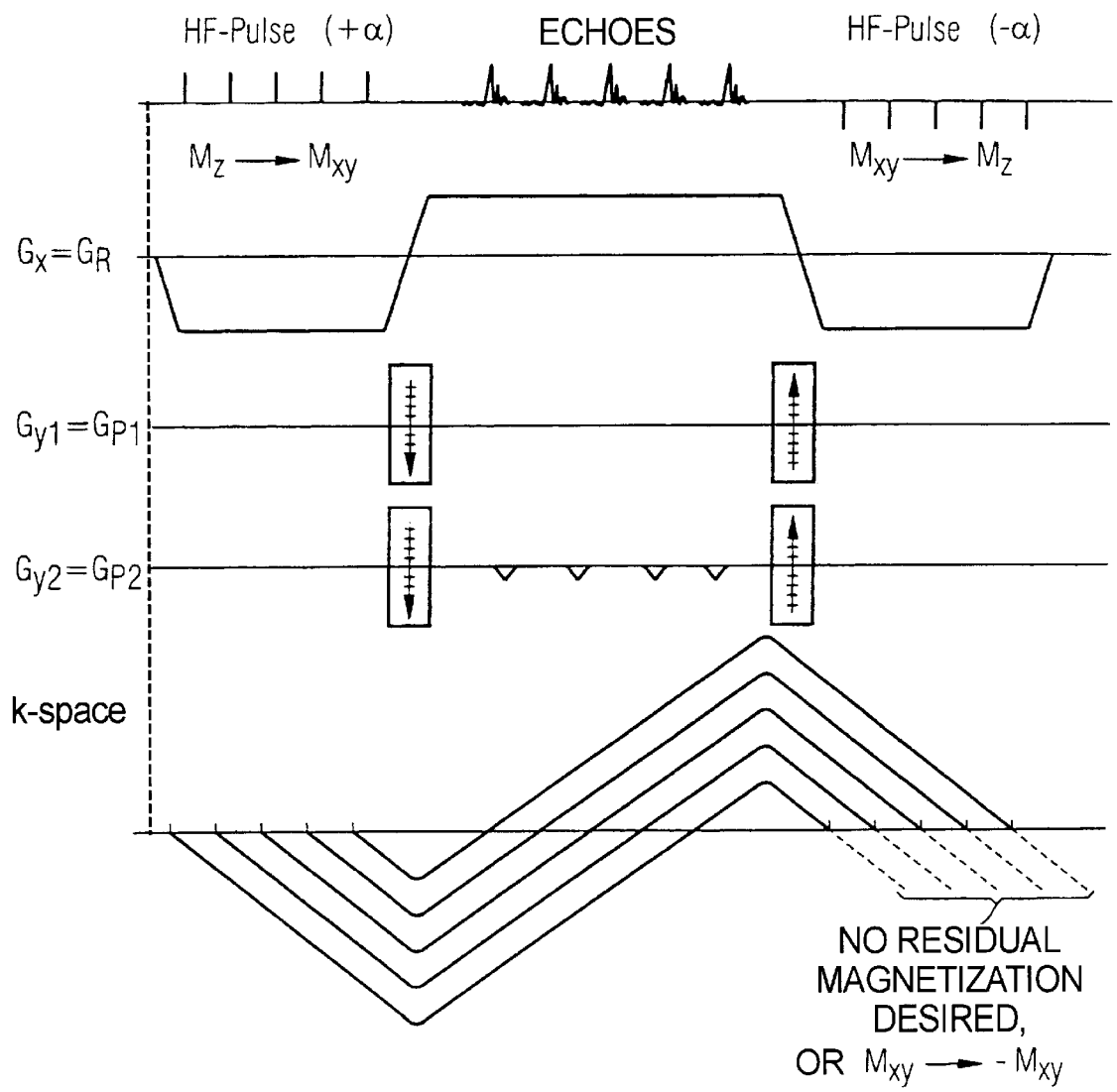
FIG. 2 is a schematic illustration of an inventive pulse sequence switching diagram.

In contrast to the known burst technique—as can be seen from FIG. 2—, the gradient switching is completely rephasing in all spatial directions from RF pulse train-to-RF pulse train, so that the steady state free precession signal behavior can be achieved. The phase modulation and, if used, amplitude modulation of the RF pulses of the RF pulse train is such that the spin echoes and stimulated echoes arising during each RF pulse train are optimally suppressed.

The second and, correspondingly, further RF pulse trains as well are of such a nature that they initially turn (deflect) the cross-magnetization arising from the previous RF pulse train back into the z-direction before they again deflect the magnetization vector for the next echo train. This embodiment is shown in FIG. 4.

Figure 3:
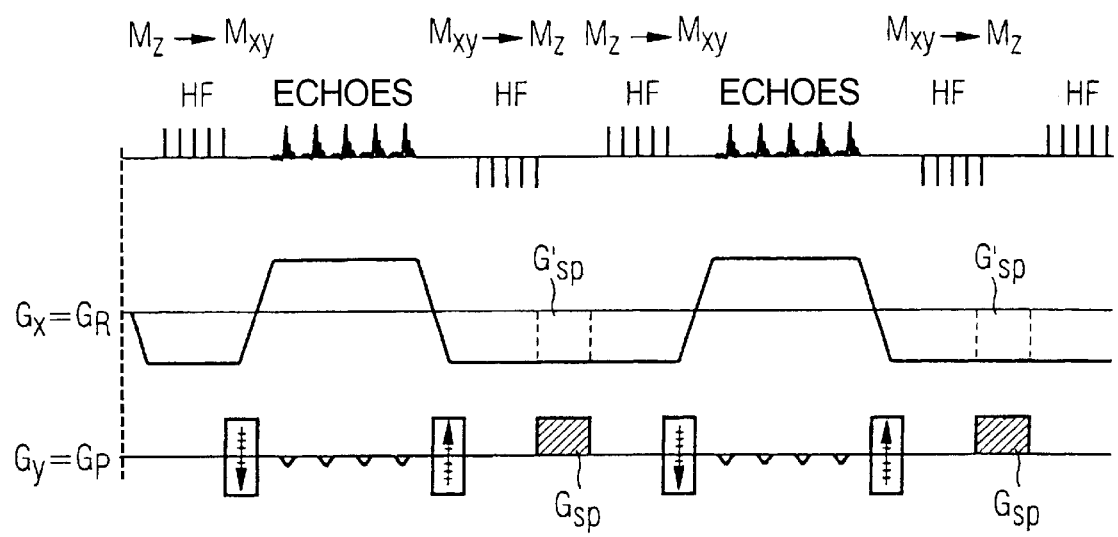
FIG. 3 shows an exemplary embodiment of the general diagram of FIG. 2.

This RF excitation diagram can also be achieved using an RF pulse train having a "re-rotating" RF pulse train part in which a second RF pulse train part again deflects the spins (embodiment of FIG. 3). By contrast, the first and the second RF pulse train part according to FIG. 4 are combined to form a single pulse train.

The spacings between the RF pulse train causing excursion of the magnetization and the RF pulse train that rotates it back each must be kept so short that an off-resonance caused by field inhomogeneities leads to a spin dephasing of a maximum of 130° through 150° in the time span between two RF pulse periods.

Figure 4:
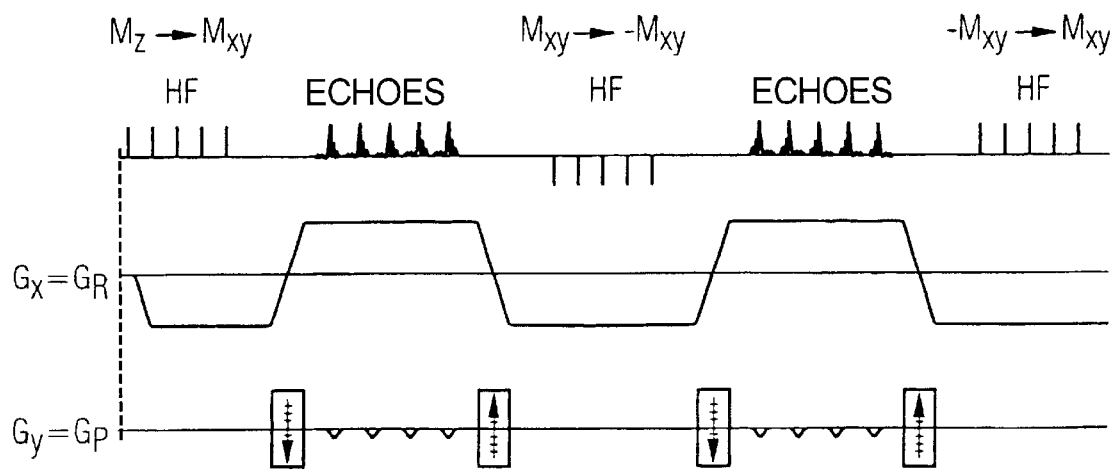
FIG. 4 shows a modification of the exemplary embodiment according to FIG. 3.

The phase coding, as usual, can be achieved by pulses preceding and following the echo train and blip gradient pulses between the individual echoes (see $G_P$ in FIGS. 2, 3 and 4). The measurement can be segmented for larger image matrix sizes. The image reconstruction can be performed, for example, by a Fourier transformation.

When a RF pulse train having a first RF pulse train part and a second RF pulse train part as was already set forth above is employed, as can be seen from FIG. 3, the phase coding gradient diagram can include a spoiler pulse $G_{SP}$ between these two RF pulse train parts. At the same point-in-time, the readout gradient switching diagram in the negative half of the readout gradient pulse train can also include a spoiler gradient $G_{SP'}$.

A further exemplary embodiment of the invention shall be explained with reference to FIG. 5.

Figure 5:
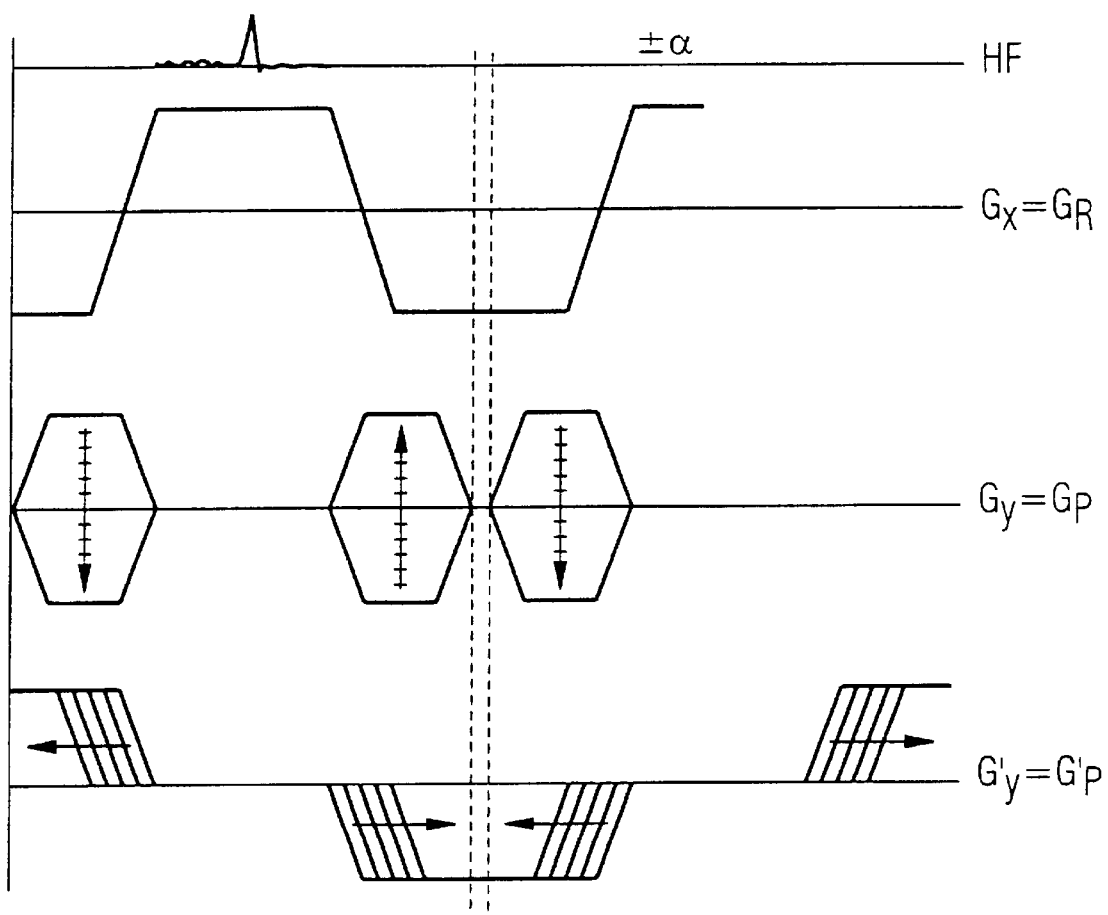
FIG. 5 shows a pulse sequence switching diagram wherein a bipolar readout gradient pulse is employed but, by contrast to the exemplary embodiments of FIGS. 2 through 4, only one RF pulse is emitted per negative half of the bipolar readout gradient pulse.

FIG. 5 shows a further exemplary embodiment of a pulse sequence according to the present invention, wherein a bipolar readout gradient pulse train $G_R$ is again employed. By contrast to the exemplary embodiment of FIG. 4, however, only one RF pulse per negative half of the bipolar gradient pulse train $G_R$ is emitted in this exemplary embodiment. As is standard in SSFP pulse sequences, the RF pulse alternates (±α). Gy(=$G_P$) and Gy'(=$G_{P'}$) in FIG. 5 thereby illustrate various possibilities of how a two-dimensional or three-dimensional phase coding can be obtained.

Otherwise, the exemplary embodiment of FIG. 5 represents a completely rephasing gradient switching diagram (by contrast to the burst technique). Differing from the known TRUE-FISP sequence (see FIG. 6), only four instead of six gradient ramps (from 0 to ±$G_{max}$) are required, enabling an enhancement of the measuring speed. The individual RF pulse emitted per negative half of the bipolar gradient pulse train can be amplitude-modulated and/or phase-modulated such that a limitation of the measuring field is achieved in the readout direction (z-direction).

According to the present invention and as can be seen from the figures, only two gradient switch ramps are required in view of the readout gradient pulse train per N echoes, allowing a nearly unlimited measuring speed derives. By contrast to known burst methods, wherein the signal rapidly decreases with increasing measuring speed, the signal amplitude is preserved given a pulse train according to the present invention, even given a high echo rate.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for rapidly obtaining image data in magnetic resonance tomography comprising the steps of:

subjecting an examination subject to a pulse sequence which causes a nuclear magnetization vector within said examination subject to oscillate between angles ±α in a steady state, wherein α is less than 90°;

in said pulse sequence, emitting a bipolar readout gradient, including a positive half and a negative half, and reading out nuclear magnetic resonance signals from said examination subject during said bipolar readout gradient; and in said pulse sequence, emitting at least one RF excitation pulse during each negative half of said bipolar readout gradient.

2. A method as claimed in claim 1 comprising emitting a plurality of RF excitation pulses during each negative half of said bipolar readout gradient.

3. A method as claimed in claim 1 comprising amplitude modulating said at least one RF excitation pulse.

4. A method as claimed in claim 1 comprising phase modulating said at least one RF excitation pulse.

5. A method as claimed in claim 1 comprising amplitude modulating and phase modulating said at least one RF excitation pulse.

6. A method as claimed in claim 1 comprising emitting a plurality of switched gradients in said pulse sequence with gradient switching of said plurality of gradients being completely rephasing in all spatial directions between each emission of said at least one RF excitation pulse.

7. A method as claimed in claim 1 comprising, during each negative half of said bipolar readout gradient, emitting a first RF excitation pulse train comprised of a plurality of RF pulses and emitting a second RF excitation pulse train comprised of a plurality of RF pulses, said first RF excitation pulse train causing magnetization in a z-direction of an x, y, z coordinate system, arising from a preceding RF excitation pulse train, to be deflected into an x, y plane, and said second RF excitation pulse train rotating said magnetization back into said z-direction.

8. A magnetic resonance tomography apparatus comprising:

a scanner having an RF coil and at least one gradient coil for subjecting an examination subject to a pulse sequence which causes a nuclear magnetization vector within said examination subject to oscillate between angles ±α in a steady state, wherein α is less than 90°;

a controller connected to said at least one gradient coil for producing, in said pulse sequence, a bipolar readout gradient, including a positive half and a negative half, for reading out nuclear magnetic resonance signals from said examination subject during said bipolar readout gradient; and said controller being connected to said RF coil for producing, in said pulse sequence, emitting at least one RF excitation pulse during each negative half of said bipolar readout gradient.

9. A magnetic resonance tomography apparatus as claimed in claim 8 wherein said controller caused said RF coil to emit a plurality of RF excitation pulses during each negative half of said bipolar readout gradient.

10. A magnetic resonance tomography apparatus as claimed in claim 8 comprising means for amplitude modulating said at least one RF excitation pulse.

11. A magnetic resonance tomography apparatus as claimed in claim 8 comprising means for phase modulating said at least one RF excitation pulse.

12. A magnetic resonance tomography apparatus as claimed in claim 8 comprising means for amplitude modulating and phase modulating said at least one RF excitation pulse.

13. A magnetic resonance tomography apparatus as claimed in claim 8 wherein said controller causes said at least one gradient coil to emit a plurality of switched gradients in said pulse sequence with gradient switching of said plurality of gradients being completely rephasing in all spatial directions between each emission of said at least one RF excitation pulse.

14. A magnetic resonance tomography apparatus as claimed in claim 8 wherein said controller caused said RF coil, during each negative half of said bipolar readout gradient, to emit a first RF excitation pulse train comprised of a plurality of RF pulses and to emit a second RF excitation pulse train comprised of a plurality of RF pulses, said first RF excitation pulse train causing magnetization in a z-direction of an x, y, z coordinate system, arising from a preceding RF excitation pulse train, to be deflected into an x, y plane, and said second RF excitation pulse train rotating said magnetization back into said z-direction.

* * * * *